(12) United States Patent
Qin et al.

(10) Patent No.: US 9,006,057 B2
(45) Date of Patent: Apr. 14, 2015

(54) METHOD OF MANUFACTURING SEMICONDUCTOR DEVICE

(75) Inventors: Changliang Qin, Beijing (CN); Peizhen Hong, Beijing (CN); Huaxiang Yin, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/989,164

(22) PCT Filed: Jul. 31, 2012

(86) PCT No.: PCT/CN2012/079402
§ 371 (c)(1),
(2), (4) Date: May 23, 2013

(87) PCT Pub. No.: WO2014/012276
PCT Pub. Date: Jan. 23, 2014

(65) Prior Publication Data
US 2014/0057404 A1 Feb. 27, 2014

(30) Foreign Application Priority Data
Jul. 16, 2012 (CN) .......................... 2012 1 0246706

(51) Int. Cl.
*H01L 21/36* (2006.01)
*H01L 27/088* (2006.01)
(Continued)

(52) U.S. Cl.
CPC ..... *H01L 21/30604* (2013.01); *H01L 21/30608* (2013.01); *H01L 21/3065* (2013.01); *H01L 29/66477* (2013.01); *H01L 21/26506* (2013.01);
(Continued)

(58) Field of Classification Search
CPC ................ H01L 21/30608; H01L 21/30617; H01L 21/3065; H01L 21/31155; H01L 21/76237; H01L 29/045; H01L 29/4175; H01L 29/665; H01L 29/66636; H01L 29/66659; H01L 29/66803; H01L 29/7397; H01L 29/7834; H01L 29/7848
See application file for complete search history.

(56) References Cited

U.S. PATENT DOCUMENTS

2003/0190766 A1 10/2003 Gonzalez et al.
2011/0049567 A1 3/2011 Peng et al.
(Continued)

FOREIGN PATENT DOCUMENTS

| CN | 1738056 A | 2/2006 |
|---|---|---|
| CN | 1902736 A | 1/2007 |
| CN | 101097955 A | 1/2008 |

OTHER PUBLICATIONS

International Search Report and Written Opinion for PCT Application No. PCT/CN2012/079402, dated Apr. 25, 2013, 9 pages.

*Primary Examiner* — Brett Feeney
*Assistant Examiner* — Pamela E Perkins
(74) *Attorney, Agent, or Firm* — Westman, Champlin & Koehler, P.A.

(57) ABSTRACT

A method of manufacturing a semiconductor device is disclosed. In one embodiment, the method comprises: forming a gate stack on a substrate; etching the substrate on both sides of the gate stack to form C-shaped source/drain grooves; and wet-etching the C-shaped source/drain grooves to form Σ-shaped source/drain grooves. With this method, it is possible to effectively increase stress applied to a channel region, to accurately control a depth of the source/drain grooves, and to reduce roughness of side walls and bottom portions of the grooves and thus reduce defects by etching the C-shaped source/drain grooves and then further wet-etching them to form the Σ-shaped source/drain grooves.

7 Claims, 3 Drawing Sheets

(51) Int. Cl.
*H01L 29/78* (2006.01)
*H01L 21/306* (2006.01)
*H01L 29/66* (2006.01)
*H01L 21/3065* (2006.01)
*H01L 21/265* (2006.01)

(52) U.S. Cl.
CPC ...... *H01L 29/66636* (2013.01); *H01L 29/7848* (2013.01)

(56) References Cited

U.S. PATENT DOCUMENTS

| | | | |
|---|---|---|---|
| 2012/0241815 A1* | 9/2012 | Kim et al. | 257/190 |
| 2012/0273886 A1* | 11/2012 | Zhong et al. | 257/347 |
| 2013/0193490 A1* | 8/2013 | Yin et al. | 257/255 |
| 2014/0127886 A1* | 5/2014 | Sung et al. | 438/478 |

\* cited by examiner

METHOD OF MANUFACTURING SEMICONDUCTOR DEVICE

CROSS-REFERENCE TO RELATED APPLICATION

This application is a Section 371 National Stage Application of International Application No. PCT/CN2012/079402, filed 31 Jul. 2012, which claims priority to Chinese Patent Application No. 201210246706.7, filed 16 Jul. 2012, in Chinese, the contents of which are hereby incorporated by reference in their entirety.

TECHNICAL FIELD

The present disclosure relates to the field of manufacturing semiconductor integrated circuits, and particularly, to a method of manufacturing a semiconductor device comprising Σ-shaped source/drain regions.

BACKGROUND

At the 90 nm node and beyond, the strained silicon technology has become a fundamental one, which improves performances of MOSFET devices by suppressing short channel effects and enhancing the mobility of carriers. In the strained silicon technology, various stress applying techniques, such as STI, SPT, SiGe embedded source and drain, stressed metallic gate, and Contact Etching Stop Layer (CESL), have been proposed. The stress is applied to a channel region by any of these techniques, so as to improve the carrier mobility, and thus to enhance the drive capability.

Among those techniques, the SiGe embedded source and drain technique is gradually adopted by most CMOS manufactures at the 90 nm node and beyond, where compressive stress is provided to press the channel in order to improve the MOSFET performances by dry-etching the source and drain and then epitaxially growing SiGe. Some companies make further developments in etching the source and drain even at the 60 nm node and beyond.

As shown in FIG. 1, on a substrate 1 having Shallow Trench Isolation (STI) 1A formed therein, a gate stack 2 comprising a gate dielectric layer 2A and a gate conductor layer 2B is formed. A gate spacer 3 is formed to surround the gate stack 2. An active region surrounded by the STI 1A is dry-etched with the gate spacer 3 as a mask. For example, anisotropic dry-etching, such as plasma etching and reactive ion etching, can be performed on the substrate 1 around the gate spacer 3, resulting in first source/drain grooves 1B. Here, two dashed lines crossing each other indicates that two (111) crystal faces intersect each other at a line which is indicated as a point A1 in the sectional view of FIG. 1. In a later wet-etching process, a wet-etching solution may have a greater etching rate at a (110) or (100) crystal face as compared with the (111) crystal faces. As a result, the etching will stop at the (111) crystal faces and also their intersection lines A1. The first grooves 1B have respective side walls (parallel to, and preferably aligned with, respective side walls of the gate spacer 3) apart from the respective intersection lines A1 at a distance of a1.

Then, as shown in FIG. 2, the first source/drain grooves 1B are further etched by a wet-etching solution (e.g., a TMAH solution) which is anisotropic to respective lattice orientations of the substrate, resulting in second source/drain grooves 1C with a Sigma (Σ)-shaped profile. Here, the etching solution also etches bottom portions of the first grooves 1B downward while etching the first grooves 1B laterally to the lines A1, so that bottom portions of the second grooves 1C are lower than the bottom portions of the first grooves 1B by a distance of b1. As shown in FIGS. 1 and 2, the distance a1 substantially determines a recess extent of the Σ-shaped source/drain grooves 1C into a channel region and thus a magnitude of stress applied to the channel region by SiGe and/or SiC epitaxially grown later. Further, the distance b1 substantially determines a depth of the grooves and thus the quality of the stressed SiGe and/or SiC source/drain regions epitaxially grown later.

Subsequently, SiGe and/or SiC is epitaxially grown in the Σ-shaped grooves 1C. Such Σ-shaped grooves are closer to the channel region and cause fewer defects in the later epitaxy process as compared with normal grooves, which helps improving the MOSFET performances.

However, in the prior art process as described above, because the finally formed Σ-shaped grooves 1C are relatively distant from the channel region, application of the stress from the stressed SiGe and/or SiC source/drain regions to the channel region is done over a relatively long distance. Therefore, the channel region has limited improvement in stress. On the other hand, the grooves 1B have their profile significantly different from the profile of the Σ-shaped grooves 1C. The difference between the profile of the grooves 1B and the profile of the Σ-shaped grooves 1C is represented by the distance a1. The distance a1 substantially determines the time required for etching the grooves 1B to form the Σ-shaped source/drain grooves 1C. Because the distance a1 is relatively great, the process of wet-etching the grooves 1B to form the grooves 1C requires either an increased etching rate or an increased etching time, both of which will cause the distance b1 increased unnecessarily, and thus increase the defects at the bottom portions of the grooves 1C and degrade the quality of the epitaxial SiGe and/or SIC.

SUMMARY

In view of the above, the present disclosure aims to provide, among others, a method of manufacturing a semiconductor device, in which C-shaped source/drain grooves are formed by etching and then are further wet-etched to form Σ-shaped source/drain grooves. With such a method, it is possible to effectively increase stress applied to a channel region, to accurately control a depth of the source/drain grooves, to reduce defects, and thus to improve performances of the device.

According to an aspect of the present disclosure, there is provided a method of manufacturing a semiconductor device, comprising: forming a gate stack on a substrate; etching the substrate on both sides of the gate stack to form C-shaped source/drain grooves; and wet-etching the C-shaped source/drain grooves to form Σ-shaped source/drain grooves.

According to an embodiment, the gate stack may comprise a gate dielectric layer and a gate conductor layer.

According to some examples, the gate dielectric layer may comprise any one of silicon oxide, silicon nitroxide, silicon nitride, and a high-K material, or any combination thereof. The high-K material may comprise composite layer(s) composed of any one or any combination of $Al_2O_3$, $HfO_2$, a Hf based high-K material including at least one of $HfSiO_x$, $HfSiON$, $HfAlO_x$, $HfTaO_x$, $HfLaO_x$, $HfAlSiO_x$, and $HfLaSiO_x$, and a rare earth based high-K material including at least one of $ZrO_2$, $La_2O_3$, $LaAlO_3$, $TiO_2$, and $Y_2O_3$. The gate conductor layer may comprise any one of polysilicon, amorphous silicon, metal such as Al, Cu, Ti, Ta, Mo, and W, and metal nitride such as TiN and TaN, or any combination thereof.

According to an embodiment, the C-shaped source/drain grooves can be formed by means of isotropic etching.

According to a further embodiment, the C-shaped source/drain grooves can be formed by means of anisotropic dry-etching followed by isotropic dry-etching.

According to a still further embodiment, forming the C-shaped source/drain grooves may comprise forming a decrystallized region by means of implanting ions into the substrate and then dry-etching the decrystallized region.

According to some examples, the implanted ions may comprise Cl, C, O, F, or N.

According to an embodiment, the C-shaped source/drain grooves can be etched with an anisotropic wet-etching solution.

According to an embodiment, after formation of the Σ-shaped source/drain grooves, the method may further comprise: epitaxially growing SiGe and/or SiC selectively in the Σ-shaped source/drain grooves to form stressed Σ-shaped source/drain regions; forming metal silicide in and/or on the stressed source/drain regions; and manufacturing interconnections.

According to an embodiment, after formation of the gate stack, or after formation of the C-shaped source/drain grooves, or after formation of the stressed Σ-shaped source/drain regions, the method may further comprise forming lightly doped source/drain extension regions and/or source/drain halo regions in the substrate on both sides of the gate stack and/or in the source/drain regions.

With the method of manufacturing the semiconductor device according to the present disclosure, it is possible to effectively increase the stress applied to the channel region, to accurately control the depth of the source/drain grooves, and to reduce roughness of side walls and bottom portions of the grooves and thus reduce the defects by etching the C-shaped source/drain grooves and then further wet-etching them to form the Σ-shaped source/drain grooves.

BRIEF DESCRIPTION OF THE DRAWINGS

Embodiments of the present disclosure are described in detail with reference to attached drawings, in which.

DETAILED DESCRIPTION

Various embodiments of the present application together with their resultant effects will be described in detail with reference to the drawings. It is to be noted that like reference symbols throughout the drawings denotes like arrangements. Terms used herein, such as first, second, upper, lower, thick, and thin, are intended to illustrate various arrangements. However, such illustrations do not imply relationships of the illustrated arrangements in terms of space, order, or layer-level, unless otherwise indicated.

Figure 3:
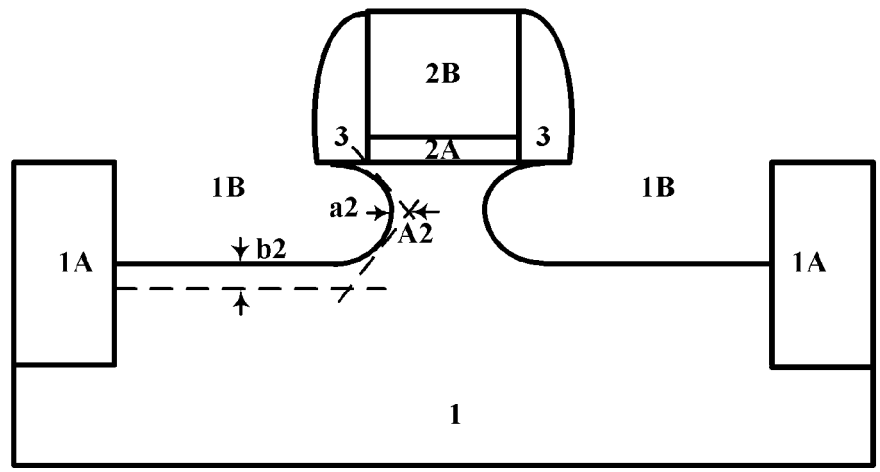
FIGS. 3 and 4 are cross-sectional views schematically showing a process of etching source/drain grooves in a method of manufacturing a semiconductor device according to an embodiment of the present disclosure.
Figure 5:
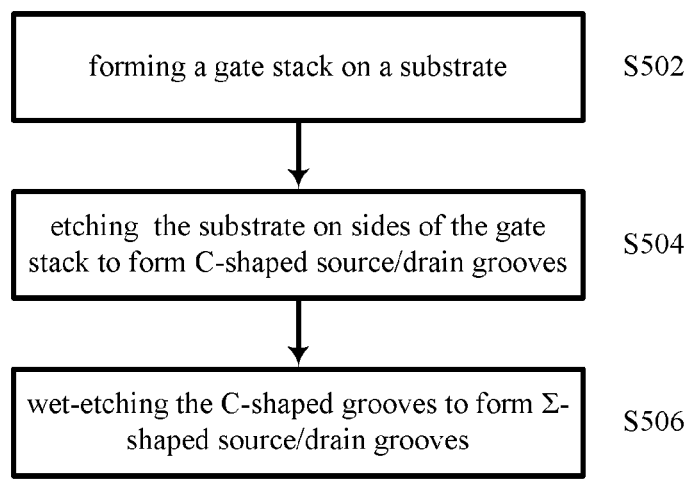
FIG. 5 is a flow chart schematically showing a method of manufacturing a semiconductor device according to an embodiment of the present disclosure.

Referring to FIG. 5 and FIG. 3, C-shaped source/drain grooves are formed by etching a substrate.

First, in an operation S502, a gate stack is formed on the substrate. Specifically, the substrate 1 is provided. The substrate may comprise bulk Si, SOI, bulk Ge, GeOI, SiGe, GeSb, or a group III-V compound semiconductor or a group II-VI compound semiconductor such as GaAs, GaN, InP, and InSb. To be compatible with the existing CMOS process and thus to be applicable to the large scale digital integrated circuit manufacture, the substrate 1 preferably comprises bulk Si or SOI, that is, a silicon wafer or a SOI wafer. Preferably, the substrate 1 may have Shallow Trench Isolation (STI) 1A formed therein by etching and then filing oxide. The STI 1A surrounds an active region, in which the substrate is doped to form lightly doped wells (not shown), such as a p-well or an n-well.

The gate stack 2 is formed on the substrate 1. The gate stack may comprise a true gate stack in the gate first process, which is reserved; or a dummy gate stack in the gate last process, which is to be removed later. Specifically, a relatively thin gate dielectric layer 2A is formed by means of deposition, such as LPCVD, PECVD, HDPCVD, MOCVD, and thermal oxidation, and a relatively thick gate conductor layer 2B is deposited by means of, for example, LPCVD, PECVD, HDPCVD, MOCVD, ALD, MBE, sputtering, evaporation, and the like. The gate dielectric layer 2A, if an oxide layer in the gate first process, may comprise any one of silicon oxide, silicon nitroxide, silicon nitride, and a high-K material, or any combination thereof. The high-K material may comprise composite layer(s) composed of any one or any combination of $Al_2O_3$, $HfO_2$, a Hf based high-K material including at least one of $HfSiO_x$, $HfSiON$, $HfAlO_x$, $HfTaO_x$, $HfLaO_x$, $HfAlSiO_x$, and $HfLaSiO_x$ (where x indicates a content of O included in the respective high-K materials, and can be appropriately set based on a targeted relative permittivity K, for example, any number between 1 and 6, but not limited to an integer number), and a rare earth based high-K material including at least one of $ZrO_2$, $La_2O_3$, $LaAlO_3$, $TiO_2$, and $Y_2O_3$. Alternatively, the gate dielectric layer 2A, if in the gate last process, may comprise silicon oxide or silicon nitroxide, and is provided for protecting a surface of a channel region of the substrate when removing the dummy gate to form a gate groove and thus is also termed as a pad oxide layer. The gate conductor layer 2B may comprise polysilicon, amorphous silicon, metal such as Al, Cu, Ti, Ta, Mo, and W, or metal nitride such as TiN and TaN. The gate dielectric layer 2A and the gate conductor layer 2B are etched to form the gate stack (or the dummy gate stack) 2.

On surfaces of the active region of the substrate 1 and the gate stack 2, a dielectric layer may be formed by conventional means, such as LPCVD, PECVD, HDPCVD, and sputtering, from a material which is relatively hard and has a relatively great etching selectivity with respect to the materials of the already formed features, such as silicon nitride, silicon nitroxide, and amorphous Diamond Like Carbon (DLC), and then is etched to form a gate spacer 3.

Next, in an operation S504, etching of portions of the substrate 1 outside the gate spacer 3 is performed with the gate spacer 3 as a mask, resulting in C-shaped source/drain grooves 1B. The etching may comprise isotropic etching (for example, wet-etching with an oxidant plus an HF based acidic etching solution, or isotropic dry-etching), or anisotropic dry-etching such as plasma etching and Reactive Ion Etching (RIE) followed by isotropic dry-etching. Alternatively, portions of the substrate 1 where source/drain regions are to be formed can be decrystallized by implanting ions such as Cl, C, O, F, and N to form decrystallized regions, and then the decrystallized regions can be dry-etched.

Figure 1:
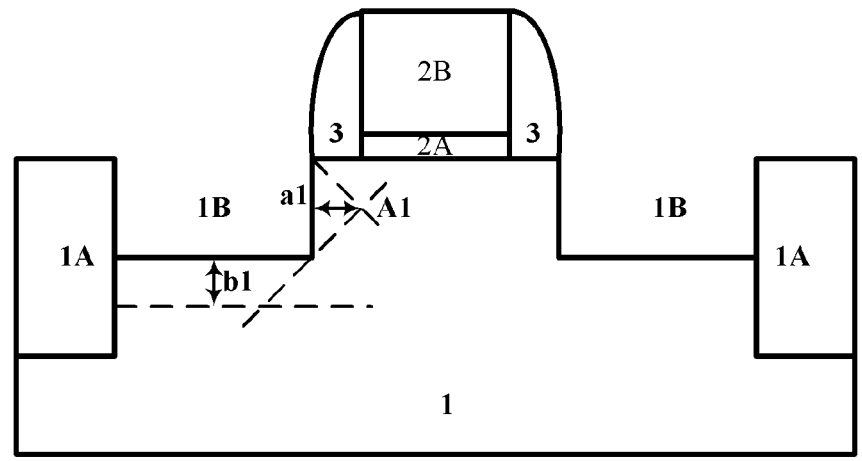
FIGS. 1 and 2 are cross-sectional views schematically showing a process of etching source/drain grooves in a prior art method of manufacturing a semiconductor device.
Figure 2:
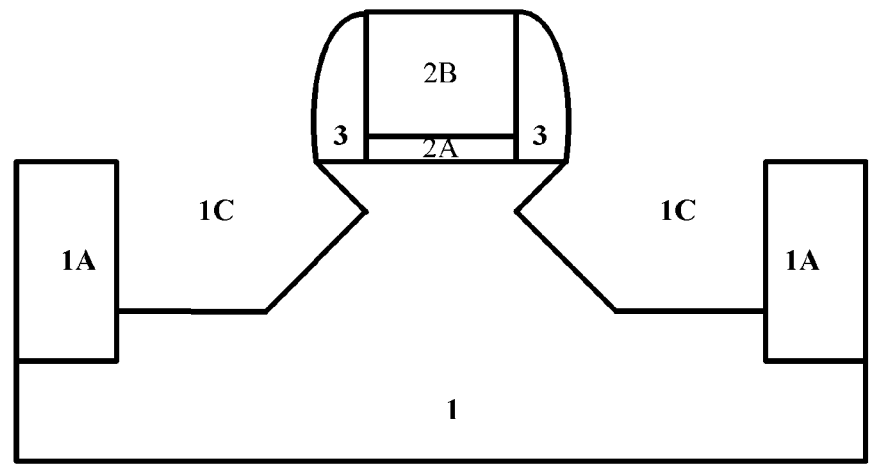

As compared with the prior art process shown in FIGS. 1 and 2, the C-shaped source/drain grooves 1B have their side walls recessed, with respect to respective side walls of the gate spacer 3, to a greater extent towards the channel region. This can be achieved by selecting process parameters such as etching gas, pressure, and flow.

The prior art process shown in FIGS. 1 and 2 adopts anisotropic etching. In the anisotropic etching, usually etching gas such as chlorine and hydrogen bromide can be used. During the etching process, polymers will be produced on the side walls so as to protect the side walls.

In contrast, in the present application formation of the C-shaped grooves is done mainly by isotropic etching, which is achieved mainly by means of chemical reaction(s). As a result, it is possible to avoid secondary etching of bottom portions, which would otherwise occur during physical bombardment. Therefore, the bottom portions are etched at a reduced rate, resulting in the C-shaped grooves. For example, the isotropic etching can be carried out with carbon-and-fluorine based gas, such as $CF_4$, $CH_2F_2$, $CH_3F$, and $CHF_3$, as the etching gas.

Further, to make the grooves extend more towards the channel region and also to prevent isotropic etching from being out of control, anisotropic etching, followed by isotropic etching, can be performed on the source/drain regions. An aspect of the present disclosure consists in formation of the C-shaped grooves which is similar in profile to sigma-shaped grooves. Thus, it takes a relatively short time to form the sigma-shaped grooves by subsequent wet-etching, and thus the bottom portions are subjected to the etching also for a relatively short period. As a result, the sigma-shaped grooves will have a groove depth which is not too great.

Specifically, so called "C-shaped source/drain grooves" mean that the side walls of the source/drain grooves 1B (especially, the side walls close to the channel region) are not (substantially) vertical ones, but are substantially curved surfaces, so that each of the grooves is wider in its middle portion than in its upper and/or lower portions. In other words, the gate spacer 3 and the gate stack 2 are suspended at least partially with respect to the source/drain grooves 1B, and thus the source/drain grooves have their respective side walls close to the channel region recessed towards the channel region. It is to be noted that the C-shaped source/drain grooves are not limited to have a semi-circle profile as shown in FIG. 3. Indeed, the C-shaped source/drain grooves can have the side walls formed in various curved surfaces, such as spherical surface, elliptic surface, hyperbolical surface, and saddle surface. The recess extent towards the channel region is greater than or equal to preferably ¼, and more preferably ½, of the depth of the source/drain grooves. Like the prior art shown in FIGS. 1 and 2, two (111) crystal faces intersects each other at a line which is indicated as a point A2 in the sectional view of FIG. 3. In this case, the C-shaped source/drain grooves have their profile closer to the profile of the Σ-shaped source/drain grooves to be formed as compared to the conventional source/drain grooves with vertical side walls. For example, the distance from the respective side walls of the C-shaped source/drain grooves 1B to the respective (111) crystal faces in the lateral direction reaches its maximum generally at the respective intersecting lines A2, the maximum being indicated as a2. The distance a2 substantially determines the time required for etching the C-shaped source/drain grooves to form the Σ-shaped source/drain grooves. Because the C-shaped grooves 1B are recessed more towards the channel region than conventional grooves with vertical walls, the distance a2 is smaller than the conventional one a1. Therefore, in a subsequent etching process to form the Σ-shaped source/drain grooves and then an epitaxy process of growing stressed source/drain regions therein, the stressed source/drain regions are formed to be closer to the channel region and thus can apply more stress to the channel region.

Figure 4:
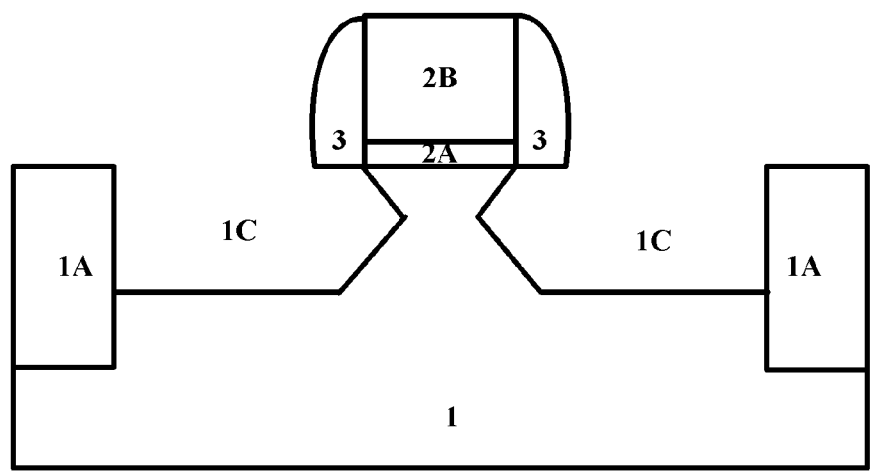

After that, referring to FIG. 5 and FIG. 4, in an operation S506, the C-shaped source/drain grooves are wet-etched to form the Σ-shaped source/drain grooves.

Preferably, the C-shaped source/drain grooves 1B are further etched by an anisotropic wet-etching solution such as a Tetra Methyl Ammonium Hydroxide (TMAH) solution. Because etching rates at respective crystal faces of the substrate 1 are different from each other, the etching will stop at the (111) crystal faces and also their intersection lines A2, resulting in the Σ-shaped source/drain grooves 1C. Here, so called "Σ-shaped source/drain grooves" mean that side walls of the source/drain grooves 1C are not vertical. ones, but are composed of two intersecting substantially planar surfaces, so that each of the grooves is wider in its middle portion than in its upper and/or lower portions. In other words, the gate spacer 3 and the gate stack 2 are suspended at least partially with respect to the source/drain grooves 1C, and thus the source/drain grooves have their respective side walls close to the channel region recessed towards the channel region. Because the source/drain grooves 1B as shown in FIG. 3 have the distance a2 smaller than the conventional one a1, the wet-etching process, if under the same etching conditions as the prior art, will have sufficient time to make surfaces of the source/drain grooves 1C smoother, while lowering bottom portions of the source/drain grooves 1C with respect to the bottom portions of the source/drain grooves 1B by a distance d2 which is not too large. This facilitates control of the profile of the Σ-shaped source/drain grooves. Further, it is also possible to manufacture the Σ-shaped grooves with reduced roughness, resulting in reduced defects in the subsequent epitaxy process. Therefore, more stress can be applied to the channel region.

Then, subsequent processes can continue like or similar to the prior art, to finish the MOSFET. For example, SiGe and/or SiC can be epitaxially grown selectively in the Σ-shaped source/drain grooves 1C to form the stressed source/drain regions. Metal silicide can be formed in and/or on the stressed source/drain regions to reduce source/drain resistances. The metal silicide may comprise NiSi, PtSi, CoSi, PtNiSi, SnSi, TiSi, and the like, for example. In the gate last process, an Inter Layer Dielectric (ILD) layer can be deposited on the entire device, and the dummy gate stack 2 can be removed by etching to form a gate groove, into which a gate dielectric layer comprising a high-K material and a gate conductor layer comprising a metallic material can be deposited to form a final gate stack. The ILD layer can be etched to form source/drain contact holes therein, into which metal such as W, Mo, and Cu can be deposited to form contact plugs, and thus to manufacture interconnections. Preferably, after formation of the gate stack 2 as shown in FIG. 3, or after formation of the C-shaped source/drain grooves 1B, or after the epitaxy of the stressed source/drain regions following the operation shown in FIG. 4, implantations can be performed to lightly doping portions of the substrate 1 on both sides of the gate stack 2, to form lightly doped source/drain extension regions (an LDD arrangement) and/or source/drain halo regions (a Halo arrangement).

One aspect of the present disclosure consists in the formation of the C-shaped grooves which is similar in profile to the sigma-shaped grooves. Thus, it takes a relatively short time to form the sigma-shaped grooves by the subsequent wet-etching, and thus the bottom portions are subjected to the etching also for a relatively short period. As a result, the sigma-shaped grooves will have a groove depth which is not too great. Further, according to the present disclosure, to form a sigma-shaped groove with the same depth as a conventional one, side walls of the sigma-shaped groove can be subjected to etching for a longer period, so that the side walls can be made smoother (because the side walls are (111) faces at which the etching rate is lowest, and thus are smoother if they are etched for a longer period). Another aspect of the present disclosure consists in etching of the C-shaped grooves which extend towards the channel region along the bottom edge of the spacer. As a result, the subsequently formed sigma-shaped grooves extend further towards the channel region. Therefore, more stress can be applied to the channel region.

With the method of manufacturing the semiconductor device according to the present disclosure, it is possible to effectively increase the stress applied to the channel region, to accurately control the depth of the source/drain grooves, and to reduce the roughness of the side walls and the bottom portion of the grooves and thus reduce the defects by etching the C-shaped source/drain grooves and then further wet-etching them to form the Σ-shaped source/drain grooves.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method of manufacturing a semiconductor device, comprising:
   forming a gate stack on a substrate;
   etching the substrate on both sides of the gate stack to form C-shaped source/drain grooves;
   wet-etching the C-shaped source/drain grooves to form Σ-shaped source/drain grooves;
   wherein forming the C-shaped source/drain grooves comprises forming a decrystallized region by means of implanting ions into the substrate and then dry-etching the decrystallized region.

2. The method according to claim 1, wherein the gate stack comprises a gate dielectric layer and a gate conductor layer.

3. The method according to claim 2,
   wherein the gate dielectric layer comprises any one of silicon oxide, silicon nitroxide, silicon nitride, and a high-K material, or any combination thereof, wherein the high-K material comprises composite layer(s) composed of any one or any combination of $Al_2O_3$, $HfO_2$, a Hf based high-K material including at least one of $HfSiO_x$, $HfSiON$, $HfAlO_x$, $HfTaO_x$, $HfLaO_x$, $HfAlSiO_x$, and $HfLaSiO_x$, and a rare earth based high-K material including at least one of $ZrO_2$, $La_2O_3$, $LaAlO_3$, $TiO_2$, and $Y_2O_3$, and
   wherein the gate conductor layer comprises any one of polysilicon, amorphous silicon, metal, and metal nitride, or any combination thereof, wherein the metal comprises Al, Cu, Ti, Ta, Mo, or W, and the metal nitride comprises TiN or TaN.

4. The method according to claim 1, wherein the implanted ions comprise Cl, C, O, F, or N.

5. The method according to claim 1, wherein the C-shaped source/drain grooves are etched with an anisotropic wet-etching solution.

6. The method according to claim 1, wherein after formation of the Σ-shaped source/drain grooves, the method further comprises:
   epitaxially growing SiGe and/or SiC selectively in the Σ-shaped source/drain grooves to form stressed Σ-shaped source/drain regions;
   forming metal silicide in and/or on the stressed source/drain regions; and
   manufacturing interconnections.

7. The method according to claim 1, wherein after formation of the gate stack, or after formation of the C-shaped source/drain grooves, or after formation of the stressed Σ-shaped source/drain regions, the method further comprises forming lightly doped source/drain extension regions and/or source/drain halo regions in the substrate on both sides of the gate stack and/or in the source/drain regions.

* * * * *